(12) United States Patent
Li et al.

(10) Patent No.: US 7,811,678 B2
(45) Date of Patent: Oct. 12, 2010

(54) LOW PROCESS TEMPERATURE THIN FILM PHOSPHOR FOR ELECTROLUMINESCENT DISPLAYS

(75) Inventors: Wu Li, Brampton (CA); Michael R. Westcott, Oakville (CA)

(73) Assignee: iFire IP Corporation, Oakville, Ontario (CA)

( * ) Notice: Subject to any disclaimer, the term of this patent is extended or adjusted under 35 U.S.C. 154(b) by 496 days.

(21) Appl. No.: 10/661,728

(22) Filed: Sep. 12, 2003

(65) Prior Publication Data
US 2005/0249971 A1 Nov. 10, 2005

Related U.S. Application Data

(60) Provisional application No. 60/410,316, filed on Sep. 13, 2002.

(51) Int. Cl.
C09K 11/56 (2006.01)
H01J 1/62 (2006.01)

(52) U.S. Cl. ............... 428/690; 428/917; 252/301.4 S; 313/503; 313/509

(58) Field of Classification Search ............. 428/690, 428/917; 313/504, 506, 503, 509; 252/301.65
See application file for complete search history.

(56) References Cited

U.S. PATENT DOCUMENTS 3,617,332 A 11/1971 Lehmann
4,208,299 A 6/1980 Oikawa et al.
5,142,192 A * 8/1992 Takahashi et al. ........... 313/506
5,652,067 A 7/1997 Ito et al.
5,677,594 A 10/1997 Sun et al.
5,776,622 A * 7/1998 Hung et al. .................. 428/690
6,242,043 B1 6/2001 Lipp
6,509,689 B1 * 1/2003 Kim et al. .................... 313/586
6,617,782 B2 * 9/2003 Cheong et al. .............. 313/503
6,699,596 B2 * 3/2004 Yano et al. .................. 428/690
2002/0031685 A1 3/2002 Yano et al.
2002/0064682 A1 5/2002 Yano et al.
2002/0094451 A1 7/2002 Li et al.

FOREIGN PATENT DOCUMENTS

JP 63-299093 * 12/1988

* cited by examiner

Primary Examiner—D. Lawrence Tarazano
Assistant Examiner—Camie S Thompson
(74) Attorney, Agent, or Firm—Fay Sharpe LLP

(57) ABSTRACT

The invention is a thin film phosphor structure that can be processed on a substrate comprising glass or glass ceramic coated with thin film electrode strips at lower temperatures. The improved phosphor structure for use in a thick film dielectric electroluminescent display comprises a phosphor laminate of a blue light emitting phosphor thin film layer and a thin fluoride containing layer provided directly adjacent the phosphor thin film layer, wherein the fluoride containing layer is provided on the top and/or bottom of the phosphor thin film layer.

29 Claims, 6 Drawing Sheets

LOW PROCESS TEMPERATURE THIN FILM PHOSPHOR FOR ELECTROLUMINESCENT DISPLAYS

This application claims the benefit of U.S. Provisional patent application Ser. No. 60/410,316, filed Sep. 13, 2002.

FIELD OF THE INVENTION

The present invention relates to blue light emitting phosphors used in full colour ac electroluminescent displays employing thick film dielectric layers with a high dielectric constant. More specifically, the invention relates to facilitating the fabrication of blue light emitting phosphors at lower temperatures and with low cost substrates in such electroluminescent displays.

BACKGROUND OF THE INVENTION

Thick film dielectric electroluminescent displays have been developed and are described for example in Applicant's U.S. Pat. No. 5,432,015 (the entirety of which is incorporated herein by reference). Such a display is constructed on a ceramic or other heat resistant substrate. The fabrication process for the display entails first depositing a set of row electrodes on the substrate followed by the deposition of a thick film dielectric layer. Following this, a thin film structure is deposited that comprises one or more thin film dielectric layers sandwiching one or more thin phosphor films and a set of optically transparent column electrodes is deposited using vacuum techniques as exemplified by Applicant's U.S. patent application Ser. No. 09/540,288 filed Mar. 31, 2000 (the entirety of which is incorporated herein by reference). The entire structure is covered with a sealing layer that protects the thick and thin film structures from degradation due to moisture or other atmospheric contaminants.

The composite dielectric layers used in these displays have a high dielectric constant, allowing the use of relatively thick dielectric layers in the displays without a significant increase in the display operating voltage. The relatively thick dielectric layer, typically greater than 10 μm, is used to prevent dielectric breakdown during display operation. Typically, the thick film layer comprises a sintered perovskite piezoelectric or ferroelectric material such as lead magnesium niobate (PMN) or lead magnesium titanate-zirconate (PMN-PT) with a dielectric constant of several thousand. There may also be applied a thinner overlayer of a compatible piezoelectric or ferroelectric material such as lead zirconate titanate (PZT) using metal organic deposition (MOD) or sol gel techniques to smooth the thick film surface for deposition of a thin film phosphor structure.

The fabrication of large area thick film electroluminescent displays for television applications requires the use of low cost substrates that can be fabricated in large areas and maintain their dimensional stability during heat treatment steps used in the display fabrication process. Thick dielectric displays are traditionally constructed on a ceramic substrate that will withstand processing temperatures up to at least 850° C. However, such substrates are typically manufactured using a tape casting process whereby a slurry is prepared comprising the ceramic material and a minor proportion of a sintering aid in powder form in a solvent based liquid vehicle containing a polymeric binder. The slurry is spread on a flexible carrier film, and is then heated to a relatively low temperature to drive off the solvent, thereby forming a flexible "green tape" that is peeled from the carrier film and then sintered at very high temperature on a refractory substrate to form the ceramic substrate. During the sintering process, shrinkage of the tape cast deposit occurs and some distortion and surface roughness of the sintered substrate will result if great care is not exercised in the sintering process. This distortion becomes a greater problem for the large area substrates required for large displays suitable for television.

As a result of the difficulties encountered in manufacturing large-area ceramic substrates, it is desirable to use glass substrates for the displays that can be manufactured using glass manufacturing techniques that do not involve sintering of green tapes. However, glass substrates have lower melting points than ceramic substrates, and so the maximum permissible temperature for manufacturing displays on glass substrates is also lower. This requires phosphor films that can be processed at lower temperatures without loss of performance and stability.

Typically, phosphor materials used in electroluminescent displays, particularly those giving blue light emission, must be annealed at temperatures of about 700° C. or higher to realize the required luminance for television application. By contrast, the maximum processing temperature for displays constructed on a glass substrate to prevent softening and consequent distortion of the substrate is about 650° C. and preferably about 600° C. Thick film dielectric layers have been developed that can be fired at a temperature at or below 650° C. as exemplified in the Applicant's U.S. provisional patent application 60/341,790 filed Dec. 21, 2001 (the entirety of which is incorporated herein by reference). Red and green phosphor materials have also been developed that can be processed at temperatures below 650° C. However, blue phosphors that can deliver the performance required to compete with CRTs for a television application must be processed at temperatures higher than this to achieve acceptable luminosity under feasible operating conditions.

It is therefore desirable to provide blue light-emitting phosphor materials and structures for use in thick film dielectric electroluminescent displays that can be processed at lower temperatures while still maintaining acceptable luminosity.

SUMMARY OF THE INVENTION

The present invention provides blue light-emitting thin film phosphor materials and structures that can be used with thick film dielectric electroluminescent displays constructed on substrates that can be processed at lower temperatures at or below about 650° C., thus making the phosphor material and structure suitable for such displays constructed on a glass substrate.

This is facilitated by the provision of a fluxing and surface modifying agent in the form of a thin layer of a fluoride material on one or both sides of the phosphor or co-deposited with the phosphor to reduce the annealing temperature required to realize adequate phosphor luminance. In the case where the fluoride is deposited as a separate layer, the fluorine in this layer may be partially infused into the phosphor film when the deposited layers are annealed to lower the formation or crystallization temperature of the phosphor film. It may also act to provide an interface between the phosphor film and adjacent dielectric layers otherwise in contact with the phosphor film to optimize the injection of electrons into the phosphor film to improve the overall electrical to optical energy conversion efficiency of the phosphor film.

The Applicant has now demonstrated that aluminum fluoride and alkaline earth fluoride compounds are suitable materials from which to form the fluoride containing layers of the invention for use with rare earth activated magnesium barium thioaluminate based or rare earth activated barium thioaluminate based phosphor materials. In one aspect, aluminum fluoride is most preferred with the use of the noted phosphor materials.

The phosphor structure of the invention in one aspect comprises a laminate where an europium activated barium thioaluminate based phosphor film or an europium activated magnesium barium thioaluminate is in contact with an alkaline earth or aluminum fluoride thin film on one or both sides of the phosphor film. The structure is formed by sequential deposition of the films on a dielectric substrate followed by a heat treatment annealing process to condition the films and the interfaces between them and the adjacent layers of the electroluminescent display to achieve an optimum luminance and emission spectrum most desirably for television applications. Alternatively, the fluoride containing material may be co-deposited with the phosphor. The europium activated barium thioaluminate based phosphor film or europium activated magnesium barium thioaluminate phosphor film may optionally incorporate up to about 25 atomic percent oxygen into the film.

According to an aspect of the present invention is an improved phosphor structure for an electroluminescent display, said structure comprising a phosphor laminate of;
  a rare earth metal activated barium thioaluminate or magnesium barium thioaluminate phosphor in contact with one or more layers of an alkaline earth or aluminum fluoride material.

According to a further aspect of the present invention is an improved phosphor structure for an electroluminescent display, said structure comprising a phosphor laminate of;
  a blue light emitting phosphor thin film layer;
    a fluoride containing layer provided directly adjacent said phosphor thin film layer, wherein said fluoride containing layer is provided on the top and/or bottom of said phosphor thin film layer.

According to a further aspect of the present invention is an improved phosphor layer for a thick film dielectric electroluminescent display, said layer comprising a rare earth activated barium or magnesium barium thioaluminate co-deposited with an alkaline earth fluoride or aluminum fluoride material wherein the volume ratio of deposited fluoride to deposited thioaluminate is in the range of about 0.02 to 0.1 and preferably in the range of about 0.05 to 0.1.

According to a further aspect of the present invention is an electroluminescent device constructed on a glass or glass ceramic substrate and comprising;
  a europium activated barium thioaluminate or magnesium barium thioaluminate phosphor film, wherein said phosphor film is in contact with at least one fluoride containing thin film.

According to a further aspect of the present invention is an electroluminescent device constructed on a glass or glass ceramic substrate and comprising;
  a rare earth activated barium or magnesium barium thioaluminate co-deposited with an alkaline earth or aluminum fluoride material wherein the volume ratio of deposited fluoride to deposited thioaluminate is in the range of about 0.02 to 0.1. The range is preferably about 0.05 to 0.1

According to still another aspect of the invention is an electroluminescent device constructed on a glass or glass ceramic substrate and comprising;
  a europium activated barium thioaluminate or magnesium barium thioaluminate phosphor film, wherein said film may optionally have oxygen incorporated therein and wherein said phosphor film is in contact with at least one thin film comprising an alkaline earth fluoride or aluminum fluoride.

According to another aspect of the present invention is method for making a laminate of a rare earth activated thioaluminate based phosphor and fluoride layer for use in a thick film dielectric electroluminescent device, said method comprising;
  deposition of a fluoride containing layer onto a glass or glass ceramic substrate incorporating a first set of address lines and a dielectric layer;
  deposition of an europium activated barium thioaluminate or magnesium barium thioaluminate phosphor film onto said fluoride layer, wherein said film may optionally have oxygen incorporated therein; and
  annealing said phosphor film at a temperature of about 600° C. to about 700° C.

The method may further comprise optionally depositing a second fluoride containing layer on top of the phosphor layer. Alternatively the fluoride material can be co-deposited with the phosphor material. Further, a second thin film dielectric layer may be deposited over the phosphor film and a set of transparent electrodes deposited on top of the entire structure to complete the display panel.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from said detailed description.

BRIEF DESCRIPTION OF THE DRAWINGS

The present invention will become more fully understood from the description given herein, and from the accompanying drawings, which are given by way of illustration only and do not limit the intended scope of the invention.

DETAILED DESCRIPTION OF THE INVENTION

The present invention relates to facilitating the fabrication of low cost large area thick film dielectric electroluminescent displays incorporating blue-light emitting phosphors for television applications by providing a thick film dielectric composition and process that can be carried out at temperatures at or below about 650° C. without compromise of the phosphor performance.

Figure 1:
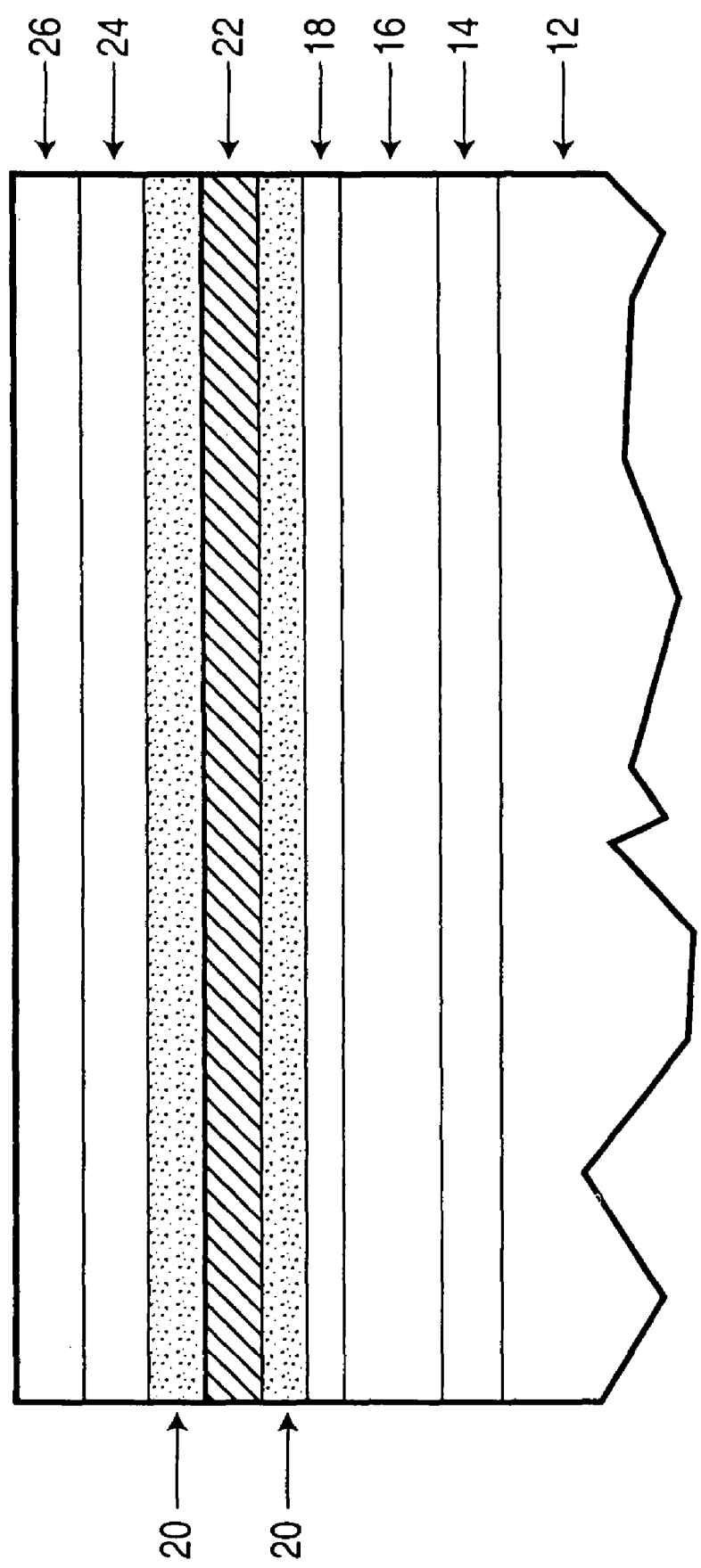
FIG. 1 shows a section of a thick film dielectric electroluminescent device showing the position of the fluxing and surface modifying layers of this invention.

FIG. 1 shows a cross section of the display showing the thick and thin film layers that comprise the display structure. Briefly, a thick film dielectric electroluminescent device of the present invention is generally indicated by reference numeral 10. The device 10 has a substrate 12 with a metal conductor layer 14 (ie. gold), a thick film dielectric layer 16 (i.e. PMT-PT) and a smoothing layer 18 (i.e. lead zirconate titanate) thereon. A variety of substrates may be used, as will be understood by persons skilled in the art such as for example a glass or glass ceramic substrate. A fluoride containing layer 20 is shown to be present adjacent the phosphor layer 22. While the fluoride containing layer 20 is shown on both sides of the phosphor, it is understood that only one such layer either above or below the phosphor may be used. A thin film dielectric layer 24 and then an ITO transport electrode 26 are present above the phosphor.

The Applicant's have surprisingly found that blue light emitting phosphors may be deposited and annealed onto glass or glass ceramic substrates at lower temperatures with little to no decrease in luminance with the provision of one or more fluxing and surface modifying agents in conjunction with the phosphor. The fluxing and surface modifying agents are in the form of a fluoride containing thin layer selected from aluminum fluoride or alkaline earth fluoride compounds to one or both sides of the phosphor to reduce the annealing temperature required to realize adequate phosphor luminance.

While certain fluoride compounds have been used in conjunction with phosphors, such use has been as a coating to individual phosphor particles as taught in U.S. Pat. No. 3,617,332, U.S. Pat. No. 6,242,043 and U.S. Patent Application No. 2002/0110702A1. Such coated phosphor particles are not suitable for use in thick film dielectric electroluminescent displays of the present invention. Metal fluorides have also been utilized as a sealing layer in an EL device as disclosed in U.S. Pat. No. 5,652,067. However, aluminum or alkaline earth fluorides have never before been contemplated for use as a fluxing and surfacing modifying agent for blue light emitting phosphors in thick film dielectric electroluminescent devices whereby such use decreases annealing temperatures without adverse effects on luminosity of the phosphor.

Due to differences in electron injection characteristics, thin film compatibility, adhesion with the phosphor material and thermal expansion characteristics, one skilled in the art would not expect that aluminum and alkaline earth fluoride compounds could prove successful fluxing and surface modifying agents for blue-light emitting phosphors for use in thick film electroluminescent displays based on the use of fluorides of the prior art.

The fluxing and surface modifying layer of the present invention may comprise a fluoride material selected from the group consisting of alkaline earth fluoride and aluminum fluoride and mixtures thereof. It is desirable that the fluoride be provided as a thin film. Preferred fluoride containing thin film layers for use in the present invention are barium fluoride, magnesium fluoride and aluminum fluoride. Aluminum fluoride is most preferred with barium thioaluminate or magnesium barium thioaluminate phosphors activated with rare earth metals that may or may not additionally have oxygen incorporated therein. The phosphor thin films for use with the fluxing and surface modifying fluoride layers of the invention may contain up to about 25 atomic percent oxygen and any range or ranges therebetween.

The fluoride layer may be provided on one or both sides (i.e. adjacent the top and/or bottom of the phosphor layer) of the phosphor and may partially infuse the phosphor layer. In this manner, the fluoride layer or layers together with the phosphor layer of a rare earth activated magnesium barium thioaluminate or rare earth activated barium thioaluminate form a phosphor laminate structure. It is understood by one of skill in the art that rare earth activated contemplates a variety of rare earth elements, most notably europium, terbium and cerium.

The placement and thickness of the fluoride layer of the invention may be varied and is limited by various factors which may include: the ease and extent with which the fluoride can chemically interact with the phosphor film during the annealing process: the extent to which the presence of the additional layer increases the required operating voltage for the device; and the extent to which the layer may cause a reduction in the transmission of light generated within the phosphor layer to the display viewer.

The thickness of the fluoride layer for use in the present invention is determined on the basis of the minimum amount of fluoride required to lower the annealing temperature of the phosphor to an acceptable value, with the maximum thickness consistent with maintaining the composition of the phosphor layer to achieve the desired luminance and colour coordinates. The maximum thickness may also be determined as that greater than which results in an excessive operating voltage drop across any residual fluoride layer remaining after phosphor annealing. An optimum thickness can readily be determined by one skilled in the art. Typical thickness of the fluoride layer may be in the range of about 5 nm to about 50 nm and preferably in the range of about 20 to 30 nm. It is understood by one of skill in the art that the thickness of the fluoride containing layer may be of any range up to about 50 nm.

When the phosphor is europium activated barium or barium magnesium thioaluminate, the preferred phosphor host composition is such that the ratio of aluminum to the sum of barium plus magnesium is between 2:1 and 6:1, preferably between 2:1 and 4:1. More specifically, the preferred phosphor composition is represented by the formula $Mg_wBa_{x-w}Al_yS_z$ where w=0-0.2, x=1.0, y=2.0-6.0 and Z=4.0-10.0 and wherein sulfur may be substituted with oxygen or oxygen may be added so that the oxygen content in the phosphor is up to about 25 atomic percent. The composition is as determined by energy dispersive x-ray analysis (EDX) on the phosphor film having a nominal thickness of about 500 nm deposited on a substrate such crystal silicon using an electron beam energy of 15 kV and a working distance from the sample of 15 millimeters. The phosphor layer thickness may be in the range of about 400 nm to 600 nm. Again, it is understood by one of skill in the art that the thickness of the phosphor layer can be of any range between about 400 nm to about 600 nm.

The use of one or more fluoride layers with blue light emitting phosphors allows for the annealing of the phosphor to occur on a substrate selected from the group consisting of glass, glass ceramic and metals. More desirably, the annealing may be done onto a glass or glass ceramic material requiring lower annealing temperatures such as up to about 700° C., more preferably up to about 650° C. and more preferably from about 600° C. to about 650° C. It is understood by one of skill in the art that the annealing may be done at any temperature or any range of up to about 700° C. Furthermore, annealing at such lower temperatures does not adversely affect the blue-light emitting phosphor performance.

The fluoride layer may be deposited by any suitable deposition method as is understood by one of skill in the art such as electron beam evaporation, sputtering and thermal evaporation. A preferred deposition method is electron beam evaporation conducted at a rate of about 40-300 Angstroms per minute at a pressure range of about 1 to $5 \times 10^{-7}$ torr onto a substrate of temperature of about 150° C.

If the fluoride is co-deposited with the phosphor material, the relative rates of fluoride and phosphor deposition should be adjusted to reflect the average composition of the combined fluoride layer and phosphor layer when the layers are deposited separately.

In summary, the present invention provides an improved phosphor structure in which blue light emitting phosphors suitable for use in thick film dielectric electroluminescent devices are provided with one or more fluoride layers directly adjacent thereto. In this manner, less expensive glass and glass ceramic substrates may be used to reduce annealing temperatures without affecting the luminosity of the phosphor.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

Example 1

Several thick film dielectric electroluminescent devices incorporating thin film phosphor layers comprising barium thioaluminate activated with europium were constructed with a top view and a cross section as shown generally in FIG. 1. The thick film substrates consisted of 5 cm by 5 cm alumina substrates having a thickness of 0.1 cm. Four pixels were constructed on a single substrate by depositing four 0.5 by 0.5 centimeter electrodes on the substrates, followed with a thick film high dielectric constant dielectric layer in accordance with the methods exemplified in Applicant's co-pending international application PCT CA00/00561 filed May 12, 2000 (the entirety of which is incorporated herein by reference). A thin film dielectric layer consisting of barium titanate, with a thickness of about 100-200 nanometers was deposited on top of the thick film dielectric layer using the sol gel technique described in Applicant's co-pending U.S. patent application Ser. No. 09/761,971 filed Jan. 17, 2001 (the entirety of which is incorporated herein by reference).

Over two of the pixels a 30 nanometer thick film of aluminum fluoride was deposited onto the barium titanate layer, followed by a 470 nanometer thick europium activated barium thioaluminate phosphor layer. The depositions were done using electron beam evaporation. The aluminum fluoride layer was deposited at a rate of 40 to 300 Angstroms per minute at a pressure of about $5 \times 10^{-7}$ Torr with the substrate at a temperature of about 150° C. from a source of aluminum fluoride chips of about 99.5% purity. The phosphor layer was deposited over all four pixels at a rate of about 470 Angstroms per minute under an atmosphere of hydrogen sulfide at a pressure of about $2 \times 10^{-4}$ torr.

The phosphor layer was deposited with the substrate at a temperature of about 350° C. using two electron beam pellets, one comprising europium doped barium magnesium sulfide and the other comprising aluminum sulfide with the relative evaporation rate of the pellets adjusted to give a nominal chemical composition for the deposited film of $Mg_wBa_{x-w}Al_yS_z$:Eu where w=0-0.2, x=1.0, y=2.0-3.0, z=4.0-5.5. The value for z may be lower if oxygen was present in the deposition atmospheres. The atomic ratio of europium to the sum of magnesium and barium was about 0.03. Following deposition of the phosphor layer the substrate with the deposited layers was annealed under nitrogen in a belt furnace using radiant heating with a temperature profile set to give about 600° C. peak temperature for about 5 minutes. The peak temperature of the device may be about 20° C. higher than the furnace peak temperature due to the thermal absorption characteristics of the device.

A 50 nanometer thick alumina layer and an indium tin oxide upper conductor film were then deposited on the phosphor layer over all four pixels according to the methods of Applicant's co-pending international application PCT CA00/00561 (the disclosure of which is incorporated herein in its entirety by reference). The completed device was annealed in air at about 550° C. following deposition of the indium tin oxide and prior to testing.

Figure 2:
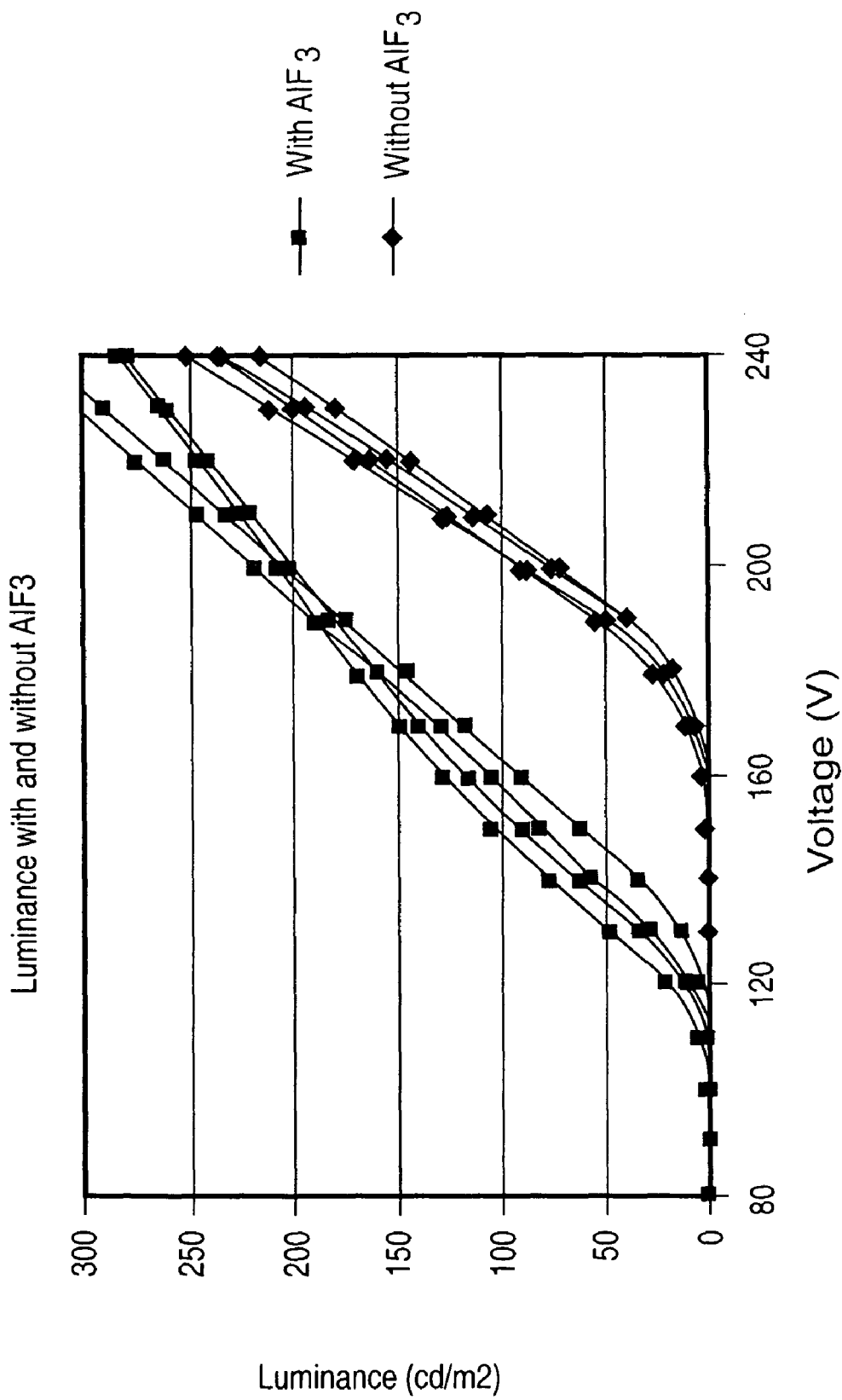
FIG. 2 is a graphical representation of the luminance of a thick film dielectric electroluminescent device having an aluminum fluoride film of the present invention as compared to that of a similar device without the aluminum fluoride layer

The electroluminescence of the pixels with the aluminum fluoride layer was measured by applying a 240 Hz alternating polarity square wave voltage waveform of variable amplitude to the device. The luminance versus applied voltage data is shown in FIG. 2. The threshold for luminance was about 120 volts and the luminance at 60 volts above the threshold voltage was about 120 candelas per square meter. The CIE "y" coordinate for the emitted light versus the applied voltage was observed to be in the range of about 0.11 to 0.12, with no significant dependence on the applied voltage.

Example 2

To show the benefit of the aluminum fluoride layer in improving the performance of the thioaluminate phosphor in devices annealed at a lowered temperature, the pixels on the devices described in Example 1 that did not have the aluminum fluoride layer were tested using the same test conditions. The comparative luminance versus voltage data is shown in FIG. 2. As can be seen from the data, inclusion of the aluminum fluoride layer lowers the threshold voltage from about 170 volts to about 120 volts while maintaining the luminance at 60 volts above the threshold voltage at about 200 candelas per square meter. The CIE "y" coordinate was in the range 0.18 to 0.19, considerably higher and disadvantageous as compared to the values in the range 0.11 to 0.12 obtained for the devices of example 1 having the aluminum fluoride layer.

Example 3

Figure 3:
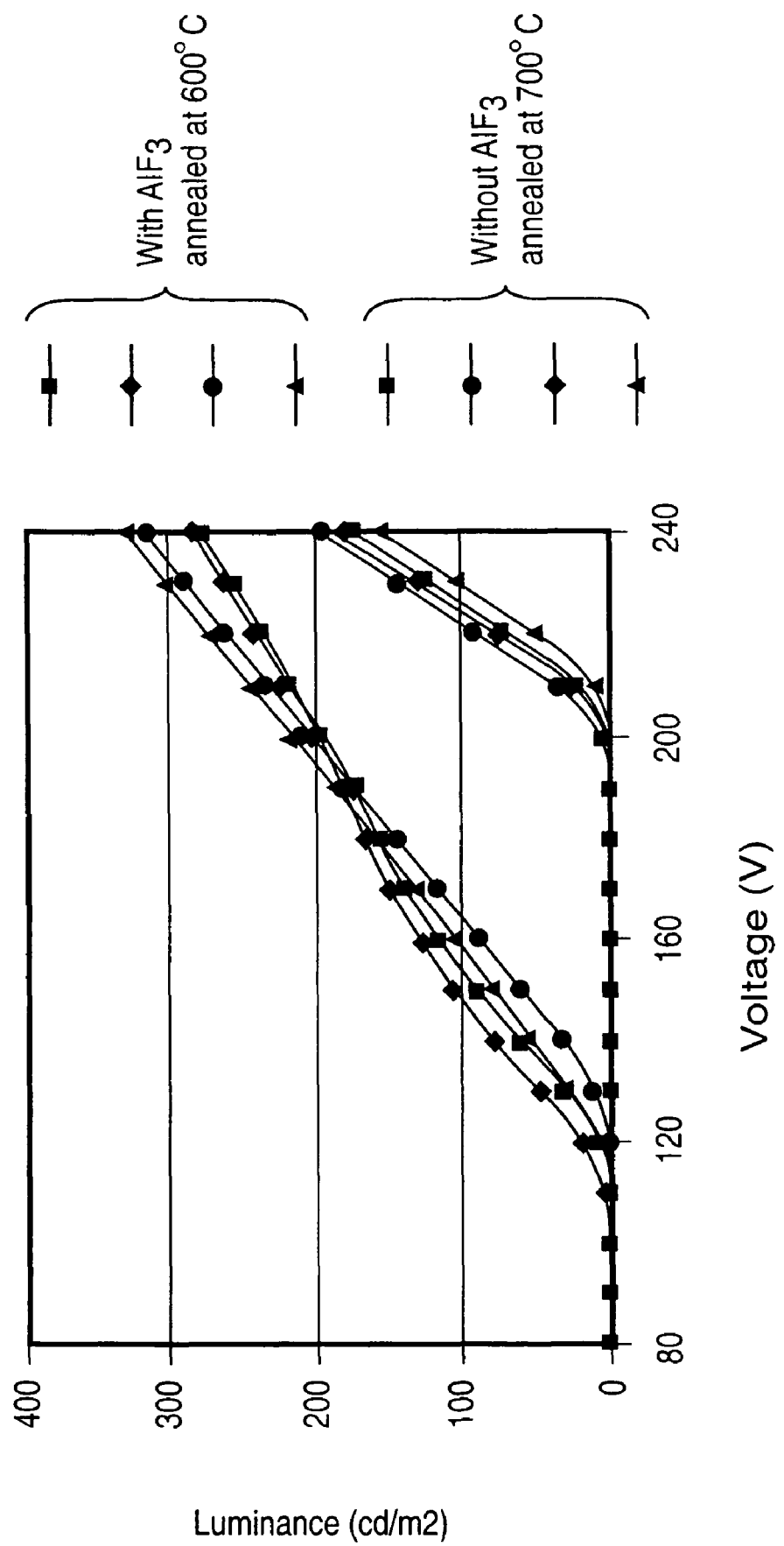
FIG. 3 is a graphical representation of the luminance of a thick film dielectric electroluminescent device with an aluminum fluoride layer that was annealed following phosphor deposition at 600° C. as compared to a device made according to the prior art without the aluminum fluoride layer and annealed at 700° C.

Several devices similar to that of example 1, but without the aluminum fluoride layer and where the phosphor was annealed at about 700° C. rather than 600° C. were constructed and tested as a measure of the performance of devices constructed according to the methods and compositions of the prior art. As for the devices of example 1, the peak temperature to which the devices were exposed may have been about 20° C. higher than the peak furnace temperature. The luminance versus voltage data for these devices is shown in FIG. 3. These devices had a threshold voltage of about 190 volts and a luminance of about 60 volts above the threshold voltage of about 200 candelas per square meter. For comparison, the luminance data for the devices of example 1 incorporating the elements of the instant invention is also shown. As can be seen from the data, the luminance for all devices at 60 volts above the threshold voltage is similar, but the devices of example 1 show a significantly lower threshold voltage. The lower threshold voltage is advantageous in that either the display operating voltage can be lowered to lower the power consumption of the device, or the phosphor thickness could be increased to increase the threshold voltage to that of the prior art device with an expectation of increased luminance. The CIE y coordinate for all of the devices was about 0.12, with no significant dependence on the applied voltage.

Example 4

To demonstrate the utility of the invention in the fabrication of electroluminescent devices processed at temperatures near the upper temperature limit that can be withstood by glass substrate materials, several devices were constructed with various metal fluoride layers adjacent to the phosphor layer and the phosphor was annealed at a temperature of 650° C. rather than 600° C.

The devices were constructed using materials and processes similar to that of example 1, except for the higher phosphor annealing temperature and the replacement of the aluminum fluoride layer with electron beam-evaporated magnesium or barium fluoride layers. These layers were 300 Angstroms thick, similar to the thickness of the aluminum fluoride layer in example 1.

Figure 4:
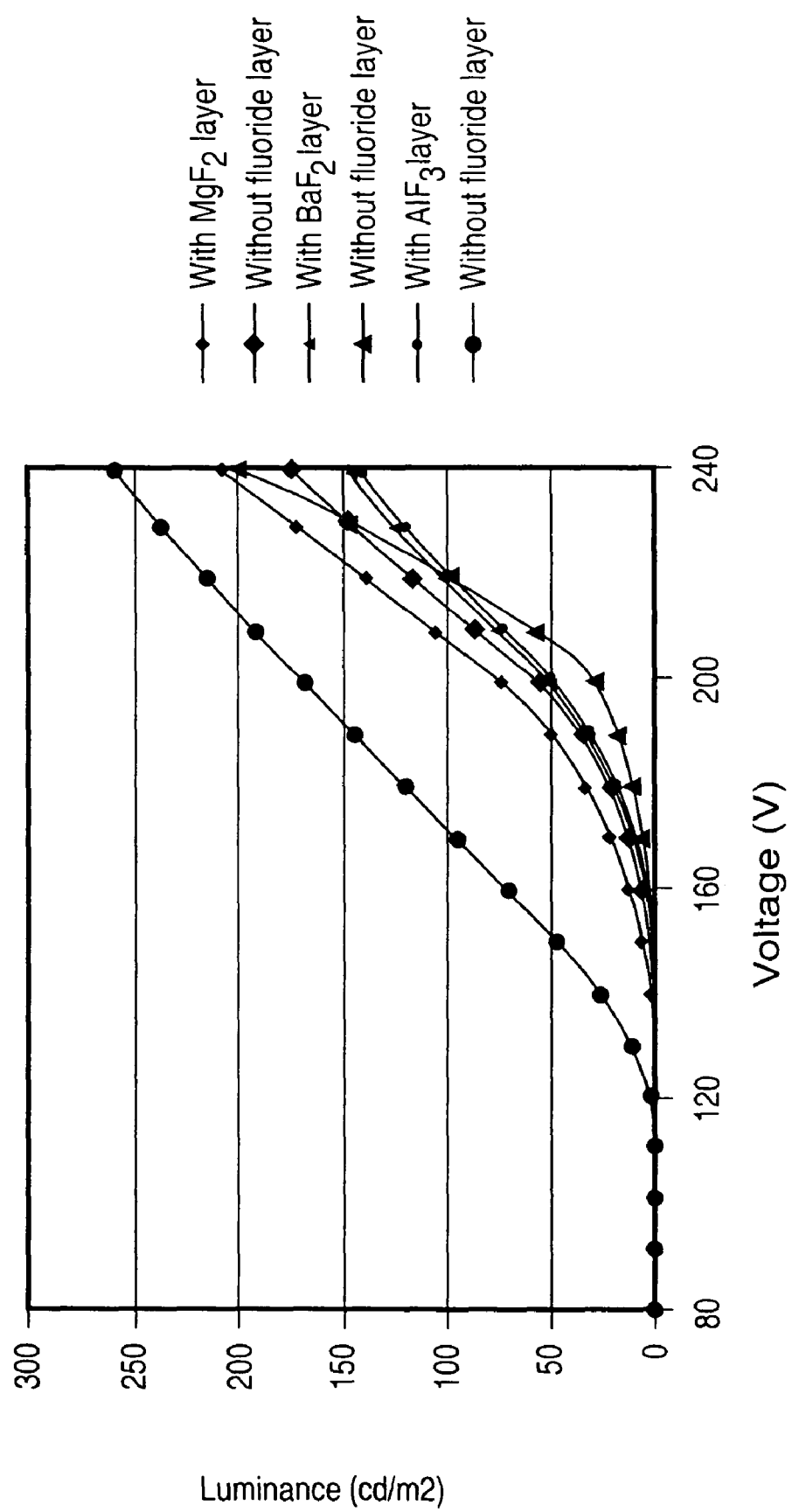
FIG. 4 is a graphical representation of the luminance of thick film dielectric electroluminescent devices with various fluoride layers of the present invention that were annealed at 650° C.
Figure 5:
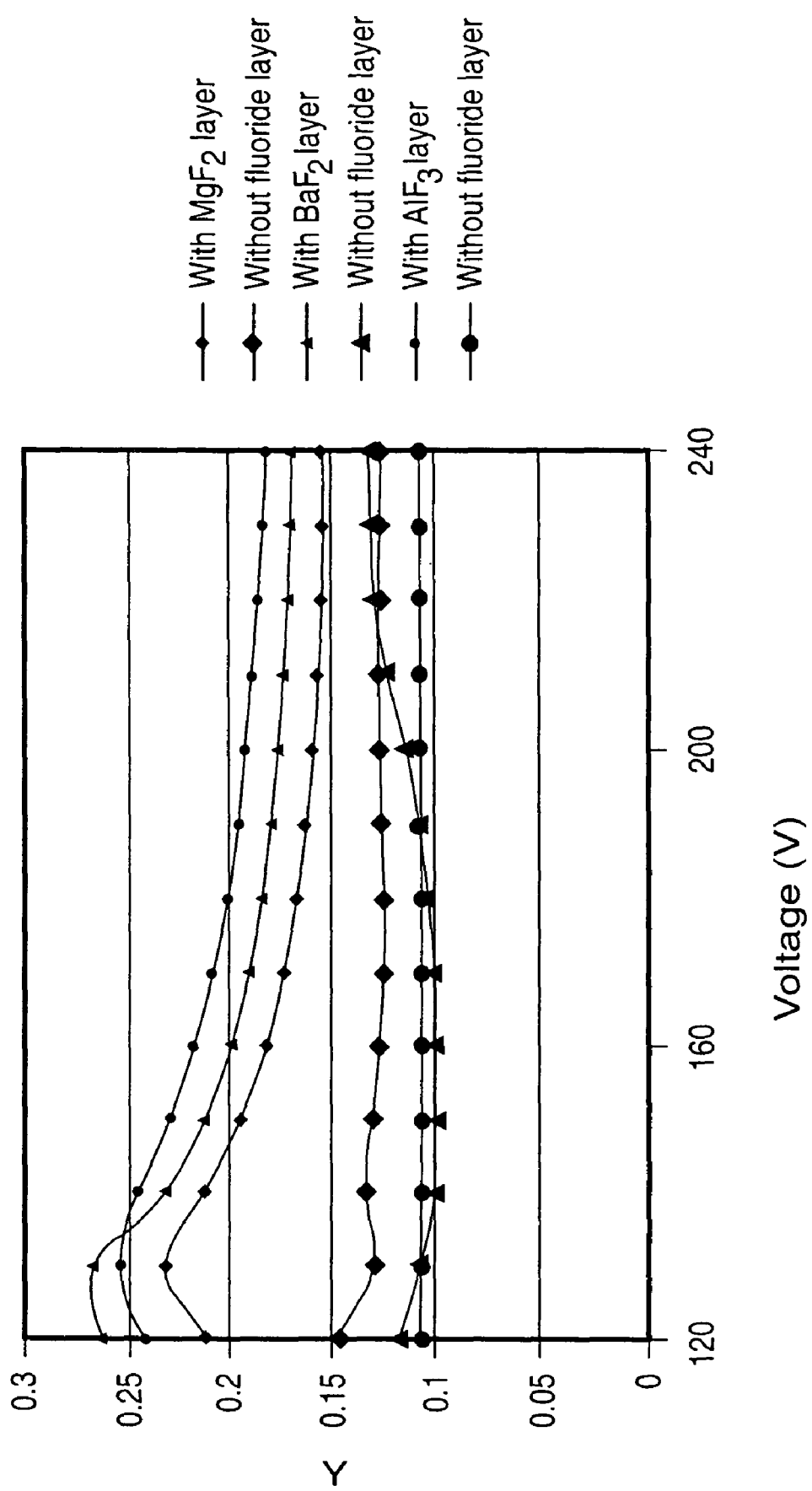
FIG. 5 is a graphical representation of the CIE y coordinate of thick film dielectric electroluminescent devices with various fluoride layers of the present invention that were annealed at 650° C.
Figure 6:
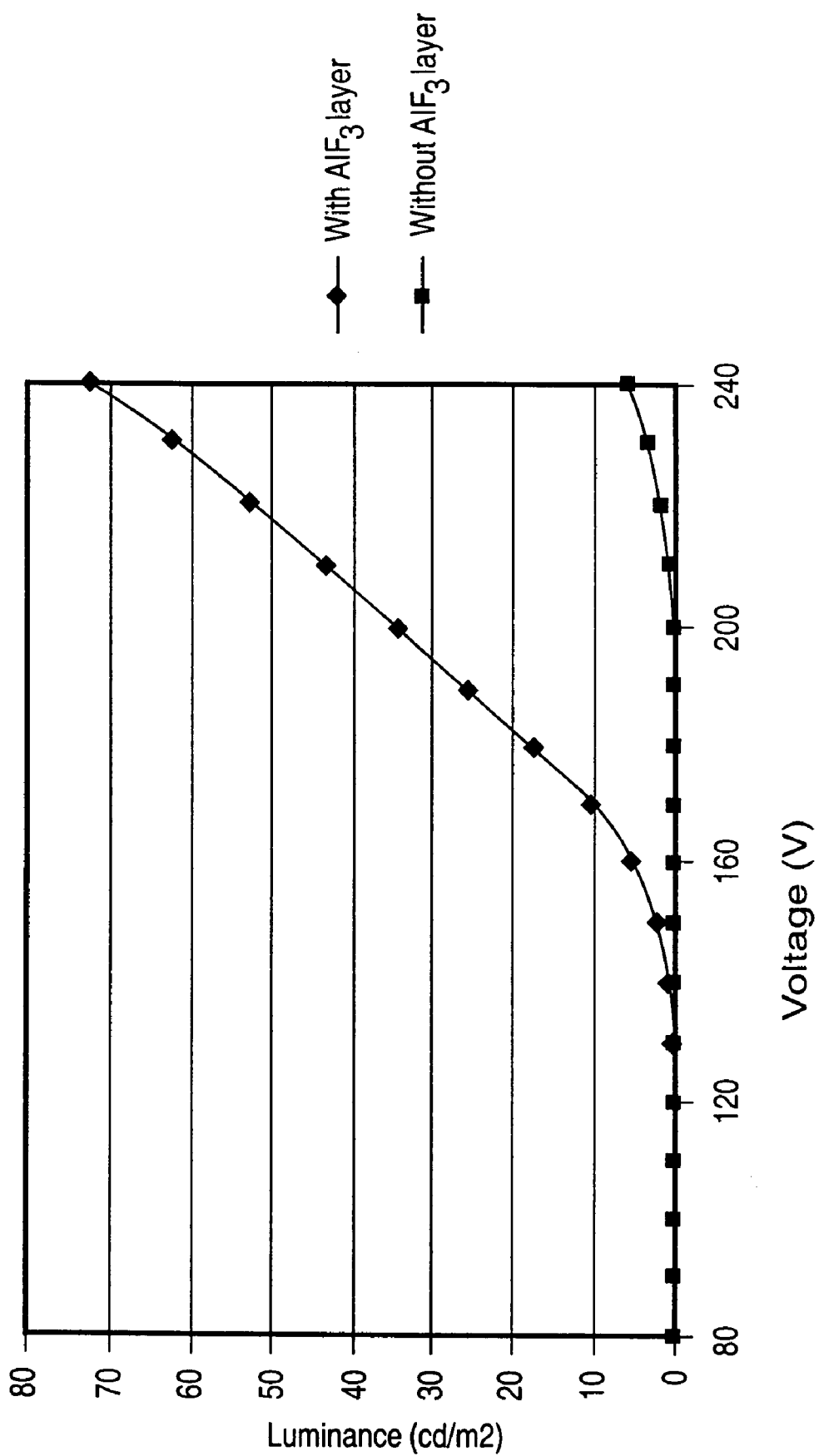
FIG. 6 is a graphical representation of the luminance versus operating time for a thick film dielectric electroluminescent device constructed on a glass substrate having an aluminum fluoride film that was annealed at 650° C. as compared to a similar device without the fluoride layers that was annealed at 700° C.

These devices were tested using the same test parameters as for the preceding examples. The luminance versus applied voltage data for them is shown in FIG. 4. As can be seen from the data, the device having the aluminum fluoride layer had the lowest threshold voltage, in accordance with that of previous examples. Devices with a magnesium fluoride layer and with a barium fluoride layer showed luminance similar to that of devices with no fluoride layer. CIE y coordinates for these devices is shown in FIG. 6. As can be seen from this data, the y coordinate for devices with magnesium, barium or aluminum fluoride layers was between 0.10 and 0.13, with very little dependence on voltage. By contrast, the y coordinate of the device without a fluoride layer was much higher, and depended significantly on voltage, making its structure unsuitable for use in displays where gray scale capability is required.

Example 5

To demonstrate the usefulness of the invention for devices constructed on a glass substrate two devices similar to those of example 3 were constructed on a 0.28 cm thick PP8C glass obtained from Nippon Electric Glass of Osaka, Japan, one with aluminum fluoride material and the other without. Comparative luminance data is shown in FIG. 4. The phosphor thickness for these devices was about 500 nm.

It can be seen from the data that although the luminance for the device with the $AlF_3$ layer on glass is less than it was for devices fabricated on alumina substrates with the $AlF_3$ layer using the same phosphor annealing temperature, the luminance at 60 volts above the threshold voltage of 140 volts for the device with the aluminum fluoride layer was about 30 candelas per square centimeter, whereas the device without the aluminum fluoride layer showed very little luminance up to the maximum test voltage of 240 volts. The difference in luminance between the devices fabricated on glass and the devices fabricated on ceramic may in part be due to a lower annealing temperature for the device on the glass substrate due to bigger temperature difference between the annealing furnace temperature and the temperature of the device due to the larger thermal mass of the glass substrate. The differences may also be due in part to a chemical interaction between the glass and the phosphor. These negative effects can be reduced or eliminated using methods known in the art.

Although preferred embodiments of the invention have been described herein in detail, it will be understood by those skilled in the art that variations may be made thereto without departing from the spirit of the invention or the scope of the appended claims.

We claim:

1. An improved phosphor structure for an electroluminescent display, said structure comprising a phosphor laminate of;
    a blue light emitting phosphor thin film layer;
    a fluoride containing layer provided directly adjacent and in contact with said phosphor thin film layer, wherein said fluoride containing layer is provided on the top and/or bottom of said phosphor thin film layer and fluorine from said fluoride containing layer partially infused into said phosphor thin film layer, without adverse effects on luminosity of the phosphor, the fluoride layer together with the phosphor layer forming the phosphor laminate;
wherein said blue light emitting phosphor thin film layer is selected from the group consisting of a rare earth metal activated barium thioaluminate and a rare earth metal activated magnesium barium thioaluminate.

2. The structure of claim 1, wherein said phosphor thin film layer is represented by $Mg_wBa_{x-w}Al_yS_z$:Eu where w=0-0.2, x=1.0, y=2.0-6.0 and z=4.0-10.0.

3. The structure of claim 2, wherein said fluoride containing layer is selected from aluminum fluoride and alkaline earth fluoride compounds and mixtures thereof.

4. The structure of claim 3, wherein said alkaline earth fluoride compounds are selected from the group consisting of barium fluoride and magnesium fluoride.

5. The structure of claim 3, wherein said fluoride containing layer has a thickness of about 5 nm to about 50 nm.

6. The structure of claim 3, wherein said structure comprises a fluoride containing layer on the top of said phosphor thin film layer and a fluoride containing layer on the bottom of said phosphor thin film layer.

7. The structure of claim 3, wherein said structure is annealed onto a substrate at an annealing temperature of up to about 700° C.

8. The structure of claim 7, wherein said structure is annealed onto a substrate at an annealing temperature of up to about 650° C.

9. The structure of claim 8, wherein said structure is annealed onto a substrate at an annealing temperature of about 600° C.

10. The structure of claim 7, wherein said substrate is selected from the group consisting of glass and glass ceramic.

11. The structure of claim 3, wherein said fluoride containing layer is deposited by electron beam evaporation.

12. The structure of claim 11, wherein said fluoride containing layer is co-deposited with said phosphor thin film.

13. The structure of claim 2, wherein said phosphor thin film layer additionally comprises oxygen.

14. The structure of claim 13, wherein said phosphor thin film layer contains up to about 25 atomic percent oxygen.

15. A thick film dielectric electroluminescent device constructed on a glass or glass ceramic substrate and comprising;

an europium activated barium thioaluminate or magnesium barium thioaluminate phosphor film, wherein said phosphor film is in contact with at least one fluoride containing thin film.

16. The device of claim 15, wherein said fluoride containing thin film is selected from the group consisting of an alkaline earth fluoride, aluminum fluoride and mixtures thereof.

17. The device of claim 16, wherein said alkaline earth fluoride is selected from the group consisting of barium fluoride and magnesium fluoride.

18. The device of claim 16, wherein said fluoride containing thin film has a thickness of about 5 nm to about 50 nm.

19. The device of claim 18, wherein said fluoride containing thin film has a thickness of about 20 nm to about 30 nm.

20. The device of claim 19, wherein said phosphor film is represented by $Mg_wBa_{x-w}Al_yS_z$:Eu where w=0-0.2, x=1.0, y=2.0-6.0 and z=4.0-10.0.

21. The device of claim 20, wherein said phosphor film has a thickness of about 400 nm to about 600 nm.

22. The device of claim 20, wherein said phosphor film has oxygen incorporated therein.

23. The device of claim 22, wherein said phosphor film has up to 25% atomic percent oxygen.

24. The device of claim 15, wherein said phosphor film is annealed at a temperature of up to about 700° C.

25. The device of claim 24, wherein said phosphor film is annealed onto said substrate at an annealing temperature of up to about 650° C.

26. The device of claim 25, wherein said phosphor film is annealed onto said substrate at an annealing temperature of about 600° C.

27. An electroluminescent display comprising:
a substrate comprised of glass or glass ceramic;
a metal conductor layer;
a smoothing layer;
an annealed phosphor laminate of,
  a blue light emitting phosphor thin film layer;
  a fluoride containing layer provided directly adjacent and in contact with said phosphor thin film layer, said fluoride containing layer provided on the top and/or bottom of said phosphor thin film layer, and fluorine from said fluoride containing layer partially infused into said phosphor thin film layer, wherein the fluoride layer together with the phosphor layer form the phosphor laminate; and
said blue light emitting phosphor thin film layer selected from a group consisting of a rare earth metal activated barium thioaluminate and a rare earth metal activated magnesium barium thioaluminate.

28. The device according to claim 27 wherein,
the phosphor layer is the barium thioaluminate activated with europium;
the thin film dielectric layer is a barium titanate layer; and
the fluoride layer is an aluminum fluoride layer.

29. The device according to claim 28, configured to have a luminance at about 60 volts above a threshold voltage of about 120 volts of about 200 candelas per square meter.

* * * * *